United States Patent
Taniguchi

(10) Patent No.: US 9,318,602 B2
(45) Date of Patent: Apr. 19, 2016

(54) SEMICONDUCTOR DEVICE AND METHOD FOR MANUFACTURING SEMICONDUCTOR DEVICE

(71) Applicant: Kabushiki Kaisha Toshiba, Tokyo (JP)

(72) Inventor: Shuichi Taniguchi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 206 days.

(21) Appl. No.: 13/926,307

(22) Filed: Jun. 25, 2013

(65) Prior Publication Data

US 2014/0084364 A1 Mar. 27, 2014

(30) Foreign Application Priority Data

Sep. 21, 2012 (JP) .................................. 2012-208841

(51) Int. Cl.
| | |
|---|---|
| H01L 29/788 | (2006.01) |
| H01L 29/78 | (2006.01) |
| H01L 21/28 | (2006.01) |
| H01L 29/66 | (2006.01) |
| H01L 29/792 | (2006.01) |
| H01L 27/115 | (2006.01) |

(52) U.S. Cl.
CPC ...... *H01L 29/7827* (2013.01); *H01L 21/28008* (2013.01); *H01L 27/11582* (2013.01); *H01L 29/66833* (2013.01); *H01L 29/7926* (2013.01)

(58) Field of Classification Search
CPC . H01L 29/788; H01L 29/792; H01L 29/7923; H01L 29/7926
See application file for complete search history.

(56) References Cited

U.S. PATENT DOCUMENTS

| | | | |
|---|---|---|---|
| 2011/0018050 A1 | 1/2011 | Fujiwara et al. | |
| 2011/0049607 A1 | 3/2011 | Yahashi | |
| 2011/0193153 A1 | 8/2011 | Higuchi et al. | |
| 2011/0220987 A1 | 9/2011 | Tanaka et al. | |
| 2011/0291178 A1* | 12/2011 | Sasaki ............... | H01L 27/11578 257/324 |
| 2012/0146127 A1* | 6/2012 | Lee et al. .................. | 257/324 |
| 2013/0161731 A1* | 6/2013 | Bin et al. .................. | 257/329 |
| 2013/0234233 A1* | 9/2013 | Fujiwara ............... | H01L 29/792 257/324 |

FOREIGN PATENT DOCUMENTS

JP   2011165815 A   8/2011

OTHER PUBLICATIONS

English translation of Office Action mailed Mar. 10, 2015, filed in corresponding Japanese Patent Application No. 2012-208841.

* cited by examiner

*Primary Examiner* — Jae Lee
(74) *Attorney, Agent, or Firm* — Patterson & Sheridan, LLP

(57) ABSTRACT

A semiconductor device according to one embodiment includes a semiconductor substrate, a back-gate layer formed above the semiconductor substrate, and a stacked body formed above the back-gate layer and comprising a plurality of insulating layers alternately formed between a plurality of electrode layers. The lowermost electrode layer of the plurality of electrode layers contains metal, and remaining electrode layers of the plurality of electrode layers other than the lowermost electrode layer do not contain the metal. Furthermore, the semiconductor device includes a pair of columnar semiconductor layers penetrating the stacked body and a semiconductor layer connecting lower portions of the pair of columnar semiconductor layers, the semiconductor layer embedded in the surface of the back-gate layer.

19 Claims, 8 Drawing Sheets

US 9,318,602 B2

SEMICONDUCTOR DEVICE AND METHOD FOR MANUFACTURING SEMICONDUCTOR DEVICE

CROSS-REFERENCE TO RELATED APPLICATION

This application is based upon and claims the benefit of priority from Japanese Patent Application No. 2012-208841, filed Sep. 21, 2012, the entire contents of which are incorporated herein by reference.

FIELD

Embodiments described herein relate generally to semiconductor devices and methods for manufacturing a semiconductor device.

BACKGROUND

A memory cell array of a semiconductor memory device generally has a structure in which a plurality of memory cells are formed in a two-dimensional plane on a silicon substrate. In order to increase memory capacity, each memory cell must be manufactured to include increasingly smaller, and more closely packed together, features. However, making the memory cell features smaller becomes a challenge in terms of cost and technique.

To solve the above-mentioned challenge, a technique of manufacturing a three-dimensional stacked memory device by three-dimensionally stacking a plurality of memory layers and processing these memory layers collectively is proposed.

As one type of this collectively-processed three-dimensional stacked memory, a pipe-shaped NAND flash memory in which a plurality of NAND strings are formed in a U-shape in the direction in which the layers are stacked is proposed. In the U-shaped NAND flash memory, one NAND string is formed as a pair of silicon pillars (a pair of columnar portions) and a pipe (a joining portion) joins and electrically connects the pair of silicon pillars at a lower end thereof. The pipe portion of the NAND string is coupled to a back-gate layer.

The process of forming the collectively-processed three-dimensional stacked memory includes, for example, forming a stacked body formed of a plurality of electrode layers functioning as control gate electrodes, and a plurality of insulating layers alternately stacked with the electrode layers. The process also includes, for example, forming a memory hole in the stacked body, forming a charge storage film on the side wall of the memory hole, and then forming a silicon pillar inside the memory hole.

However, when the number of electrode layers and insulating layers (the number of stacked electrode layers and insulating layers) forming the stacked body is increased, the processing of the stacked body to form a hole therein becomes a challenge. As a result, process variation and device characteristic variations tend to arise.

DETAILED DESCRIPTION

A semiconductor device according to one embodiment includes: a semiconductor substrate; a back-gate layer formed above the semiconductor substrate; and a stacked body formed above the back-gate layer and comprising a plurality of insulating layers alternately formed between a plurality of electrode layers. The lowermost electrode layer of the plurality of electrode layers contains a metal, and remaining electrode layers of the plurality of electrode layers other than the lowermost electrode layer do not contain the metal of the lowermost electrode layer. Furthermore, the semiconductor device includes: a pair of columnar semiconductor layers penetrating the stacked body; and a semiconductor layer connecting lower portions of the pair of columnar semiconductor layers, the semiconductor layer embedded in a surface of the back-gate layer.

Hereinafter, an exemplary embodiment will be described with reference to the drawings. The following embodiment is explained using a silicon semiconductor, but a semiconductor other than a silicon may be used.

First Embodiment

Figure 1:
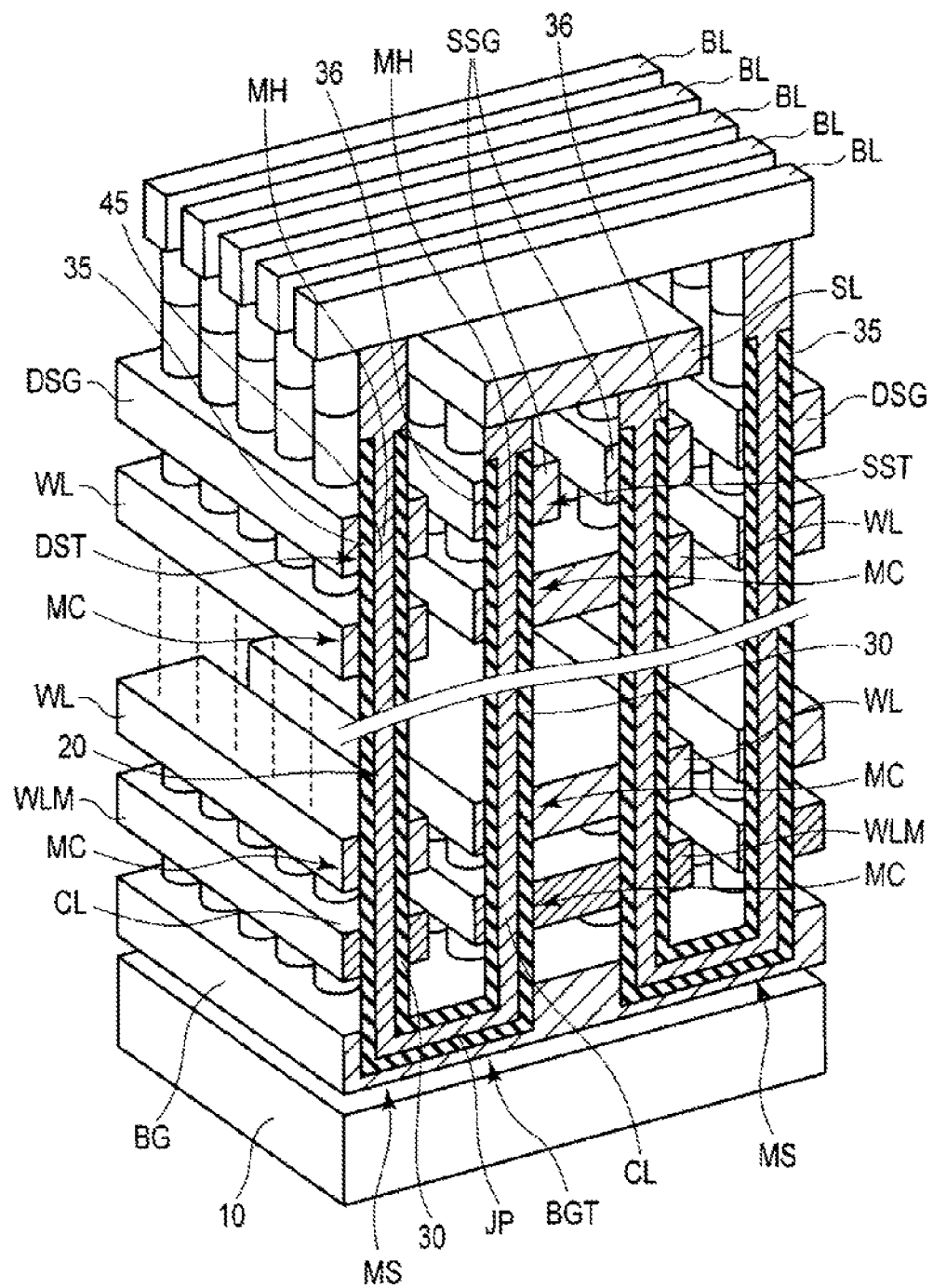
FIG. 1 is a perspective view schematically showing a memory cell array of a semiconductor device according to one embodiment.
Figure 2:
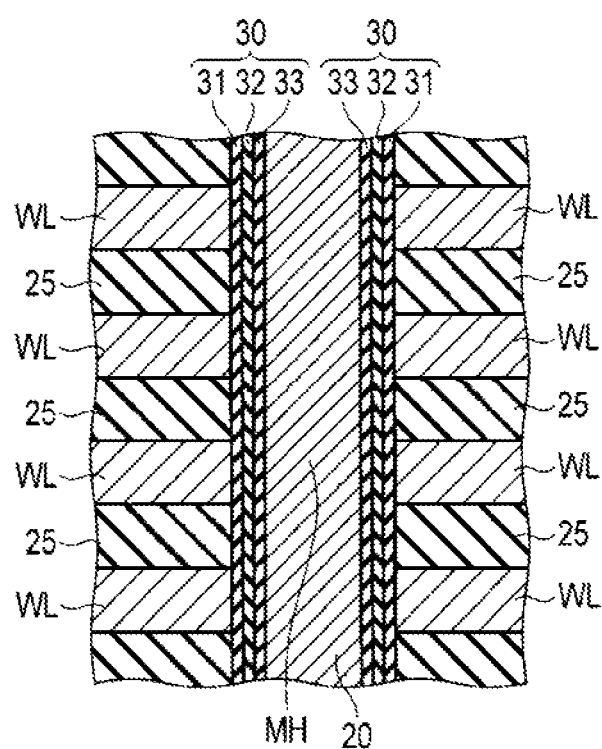
FIG. 2 is a sectional view schematically showing a memory string in the memory cell array of FIG. 1.
Figure 3:
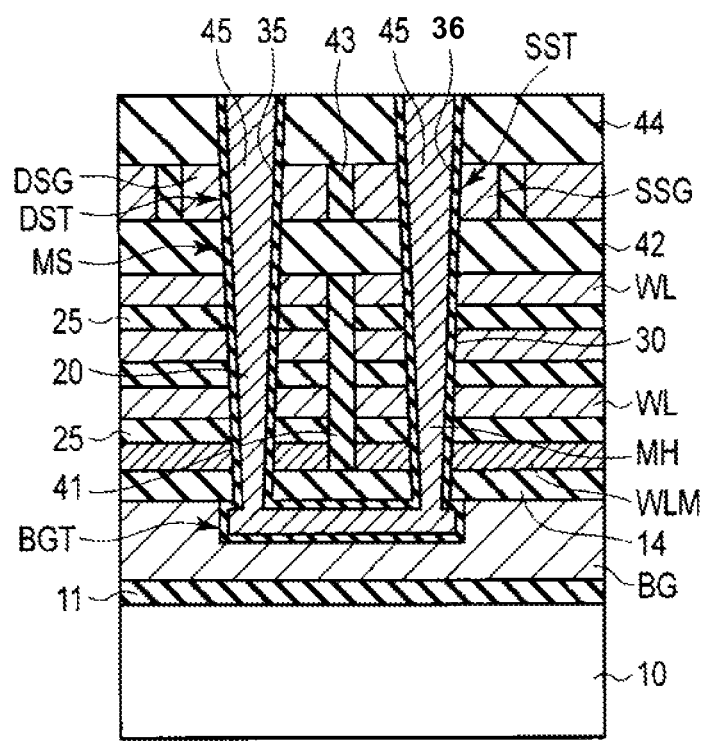
FIG. 3 is an enlarged sectional view showing a portion of FIG. 1 in which the memory cell is provided.

FIG. 1 is a perspective view schematically showing a memory cell array of a semiconductor device according to one embodiment. In FIG. 1, insulating members other than an insulating film formed on the inner wall of a memory hole MH are omitted for ease of explanation. FIG. 2 is a sectional view schematically showing one memory string MS in the memory cell array of FIG. 1. FIG. 3 is an enlarged sectional view showing a portion of a memory cell MC of FIG. 1.

On a silicon substrate 10, a back-gate layer BG is provided with an insulating layer 11 shown in FIG. 3 placed between the silicon substrate 10 and the back-gate layer BG. The back-gate layer BG is, for example, a silicon layer containing impurities and possessing electrical conductivity.

On the back-gate layer BG, an electrode layer WLM is provided with an insulating layer 14 placed between the back-gate layer BG and the electrode layer WLM. The electrode layer WLM is, for example, a metal layer containing tungsten. On the electrode layer WLM, a plurality of insulating layers 25 and a plurality of electrode layers WL are alternately stacked. An arbitrary number of the electrode layers WL and insulating layers 25 may be alternately stacked. The insulating layer 25 is interposed between the electrode layer WLM and the electrode layer WL.

That is, on the back-gate layer BG, a stacked body formed of the insulating layers 14 and 25 and the electrode layers WLM and WL, the stacked body formed of the insulating layers and the electrode layers that are alternately stacked, is formed. The uppermost layer of the stacked body may be either the electrode layer WL or the insulating layer 25.

The electrode layer WL is, for example, a silicon layer containing impurities and possessing electrical conductivity. The insulating layer 25 is, for example, a TEOS (tetraethoxysilane) layer containing silicon oxide.

In the drawing, the electrode layer WLM is thinner than the electrode layer WL. However, the electrode layer WLM may be thicker than the electrode layer WL.

The stacked body including the electrode layers WL and WLM and the insulating layers 14 and 25 in the memory cell array region is divided into a plurality of blocks in the direction of the length of a bit line BL, and an insulator 41 (FIG. 3) is embedded between the blocks.

On the electrode layer WL, which is the uppermost layer in a block, a drain-side selection gate DSG is provided with an insulating layer 42 placed between the electrode layer WL and the drain-side selection gate DSG. The drain-side selection gate DSG is, for example, a silicon layer containing impurities and possessing electrical conductivity. On the electrode layer WL, which is the uppermost layer in a block (next to the block having the drain-side selection gate DSG), a source-side selection gate SSG is provided with the insulating layer 42 placed between the electrode layer WL and the source-side selection gate SSG. The source-side selection gate SSG is, for example, a silicon layer containing impurities and possessing electrical conductivity. Between the drain-side selection gate DSG and the source-side selection gate SSG, an insulating layer 43 is interposed.

On the drain-side selection gate DSG and the source-side selection gate SSG, an insulating layer 44 (shown in FIG. 3) is provided. On the source-side selection gate SSG, a source line SL shown in FIG. 1 is provided with the insulating layer 44 (of FIG. 3) placed between the source-side selection gate SSG and the source line SL. The source line SL is a metal layer or a silicon layer doped with impurities and possessing electrical conductivity. On the source line SL, a plurality of bit lines BL are provided with an un-illustrated insulating layer placed between the source line SL and the bit lines BL.

In the back-gate layer BG and the stacked body on the back-gate layer BG, a plurality of memory holes MH in the shape of the letter U are formed.

In a block including the drain-side selection gate DSG, a hole MH penetrating the insulating layer 44, the drain-side selection gate DSG, the insulating layer 42, the electrode layers WL, the insulating layers 25, the electrode layer WLM, and the insulating layer 14 and extending in the direction in which the layers forming the stacked body are stacked is formed.

In a block including the source-side selection gate SSG, a hole MH penetrating the insulating layer 44, the source-side selection gate SSG, the insulating layer 42, the electrode layers WL, the insulating layers 25, the electrode layer WLM, and the insulating layer 14 and extending in the direction in which the layers forming the stacked body are stacked is formed.

As will be described later, holes of the above-described pair of holes are connected to each other via a concave portion formed in the back-gate layer BG, whereby the memory hole MH in the shape of the letter U is obtained.

Inside the memory hole MH, channel bodies 20 and 45 in the shape of the letter U are provided. The channel bodies 20 and 45 are, for example, silicon films. In a portion penetrating the electrode layers WL, the insulating layers 25, the electrode layer WLM, and the insulating layer 14 and in the back-gate layer BG, the channel body 20 is provided.

Between the channel body 20 and the inner wall of the memory hole MH, an insulating film 30 is provided. The insulating film 30 has, for example, an ONO (oxide-nitride-oxide) structure in which a silicon nitride film is sandwiched between a pair of silicon oxide films.

In a portion penetrating the drain-side selection gate DSG and in a portion penetrating the source-side selection gate SSG, the channel body 45 is provided. Between the channel body 45 and the drain-side selection gate DSG, a gate insulation film 35 is provided. Between the channel body 45 and the source-side selection gate SSG, a gate insulation film 36 is provided.

Incidentally, the structure is not limited to a structure in which the inside of the memory hole MH is completely filled with the channel bodies 20 and 45, and a structure in which the channel bodies 20 and 45 are formed in such a way that a cavity or void remains on the side of the memory hole MH where the central axis thereof is located and the insulator is embedded in the cavity may be adopted.

As shown in FIG. 2, between the electrode layer WL and the channel body 20, a first insulating film 31, a charge storage film 32, and a second insulating film 33 are provided in this order from the side where the electrode layer WL is located.

The first insulating film 31 is in contact with the electrode layers WL and WLM. The second insulating film 33 is in contact with the channel body 20. Between the first insulating film 31 and the second insulating film 33, the charge storage film 32 is provided. The same structure (the insulating film 31, the charge storage film 32, and the second insulating film 33) is present between the electrode layer WLM and the channel body 20.

The channel body 20 functions as a channel in a transistor forming a memory cell, the electrode layer WL functions as a control gate, and the charge storage film 32 functions as a data memory layer that accumulates charges injected from the channel body 20. That is, at an intersection of the channel body 20 and each electrode layer WL, a memory cell with a structure in which the channel is surrounded with the control gate is formed.

The semiconductor device according to this embodiment is a nonvolatile semiconductor memory device that allows data to be electrically erased and written unrestrictedly and can maintain the memory content even after the power is turned off. For example, the memory cell is a charge trapping memory cell.

The charge storage film 32 has a large number of traps that confine charges (electrons) and is, for example, a silicon nitride film.

The second insulating film 33 is, for example, a silicon oxide film (a tunnel insulating film) and serves as a potential barrier when charges are injected into the charge storage film 32 from the channel body 20 or when the charges accumulated in the charge storage film 32 diffuse into the channel body 20.

The first insulating film 31 is, for example, a silicon oxide film and prevents the charges accumulated in the charge storage film 32 from diffusing into the electrode layer WL.

The drain-side selection gate DSG, the channel body 45, and the gate insulation film 35 between the drain-side selection gate DSG and the channel body 45 form a drain-side selection transistor DST. The channel body 20 and the channel body 45 in a block including the drain-side selection transistor DST are electrically connected to each other, and an upper end of the channel body 45 is connected to the bit line BL shown in FIG. 1.

The source-side selection gate SSG, the channel body 45, and the gate insulation film 36 between source-side selection gate SSG and the channel body 45 form a source-side selection transistor SST. The channel body 20 and the channel body 45 in a block including the source-side selection transistor SST are electrically connected to each other, and an upper end of the channel body 45 is connected to the source line SL shown in FIG. 1.

The back-gate layer BG and the channel body 20 and the insulating film 30 provided in the back-gate layer BG form a back-gate transistor BGT.

Between the drain-side selection transistor DST and the back-gate transistor BGT, a plurality of memory cells MC, each using a corresponding electrode layer WL as a control gate, are provided, and the number thereof corresponds to the number of electrode layers WL.

Likewise, between the back-gate transistor BGT and the source-side selection transistor SST, a plurality of memory cells MC, each using a corresponding electrode layer WL as a control gate, are also provided, and the number thereof corresponds to the number of electrode layers WL.

These memory cells MC, the drain-side selection transistor DST, the back-gate transistor BGT, and the source-side selection transistor SST are connected in series and form one memory string MS in the shape of the letter U.

One memory string MS has a pair of columnar portions CL extending in the direction in which the layers of the stacked body are stacked (substantially orthogonal to the plane of a major surface of the silicon substrate 10). The stacked body includes the electrode layers WL, and a joining portion JP that is embedded in the back-gate layer BG and joins the pair of columnar portions CL. As a result of a plurality of memory strings MS being arranged in a column direction and a row direction of the memory cell array, the memory cells MC are three-dimensionally provided in the column direction, the row direction, and the direction in which the layers are stacked.

In this embodiment, the electrode layer WLM functions as a control gate of a transistor (which is a dummy cell) surrounding the channel body 20. The insulating film 30 is provided between the electrode layer WLM and the channel body 20, the insulating film 30 including the charge storage film 32. The data is not written into the charge storage film 32 in the dummy cell, and the dummy cell does not function as a memory cell that stores and retains data.

This is because the electrode layer WL and the electrode layer WLM are made of different materials and there is characteristic variation between the transistor using the electrode layer WL as a control gate and the transistor using the electrode layer WLM as a control gate.

However, when the range of the characteristic variation described above is adequately narrow, the transistor using the electrode layer WLM as a control gate can also be used as a memory cell.

The electrode layer WLM functions as an etch stop layer for preventing etching of a sacrificial oxide film when the memory hole is formed by etching the stacked body. Hereinafter, a further explanation will be given regarding this aspect.

FIGS. 4 to 14 are sectional views for explaining a method for manufacturing the semiconductor device according to one embodiment. FIGS. 4 to 14 are sectional views in the column direction.

Figure 4:
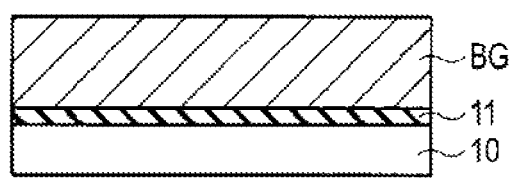
FIG. 4 is a sectional view for explaining a method for manufacturing the semiconductor device according to one embodiment.

First, as shown in FIG. 4, an insulating layer 11 is formed on a silicon substrate 10, and a back-gate layer BG is then formed on the insulating layer 11.

Figure 5:
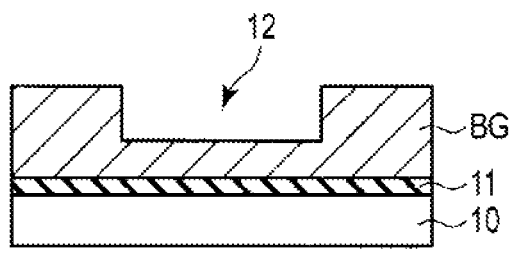
FIG. 5 is a sectional view for explaining the method for manufacturing the semiconductor device according to the embodiment, the sectional view showing a process following the process of FIG. 4.

Next, as shown in FIG. 5, a concave portion 12 is formed in the surface of the back-gate layer BG.

Figure 6:
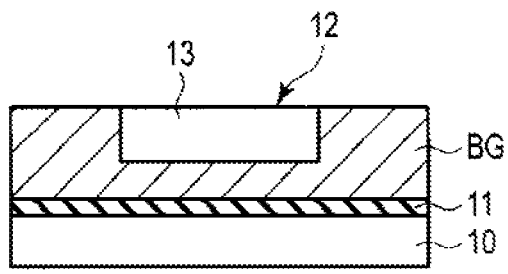
FIG. 6 is a sectional view for explaining the method for manufacturing the semiconductor device according to the embodiment, the sectional view showing a process following the process of FIG. 5.

Then, as shown in FIG. 6, a sacrificial film 13 is embedded in the concave portion 12. The sacrificial film 13 is embedded in the concave portion 12 followed by a CMP (chemical mechanical polishing) process, for example. As the sacrificial film 13, a silicon nitride film or a carbon film, for example, can be used.

Figure 7:
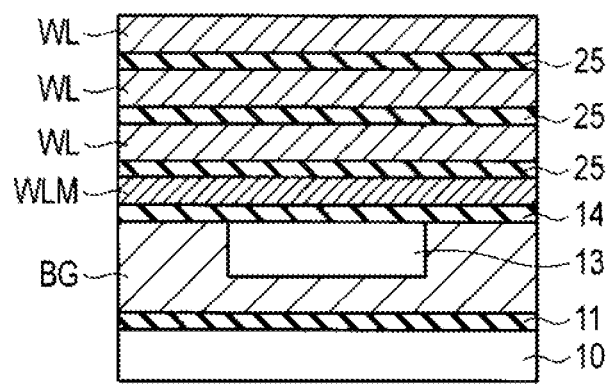
FIG. 7 is a sectional view for explaining the method for manufacturing the semiconductor device according to the embodiment, the sectional view showing a process following the process of FIG. 6.

Next, as shown in FIG. 7, an insulating layer 14 is formed on the back-gate layer BG and the sacrificial film 13, and an electrode layer WLM is then formed on the insulating layer 14. Furthermore, a plurality of insulating layers 25 and a plurality of electrode layers WL are alternately stacked on the electrode layer WLM.

The formation of the insulating layer 14, the electrode layer WLM, the insulating layers 25, and the electrode layers WL is performed by using a CVD (chemical vapor deposition) process, for example. The material of the electrode layer WLM is different from the material of the sacrificial film 13. For example, the material of the electrode layer WLM is tungsten or tungsten silicide. The electrode layers WL are formed to have almost the same thickness. The electrode layer WLM is formed to be thinner than the electrode layer WL, for example. As a result, an electrode layer WLM containing metal can be etched easily.

Figure 8:
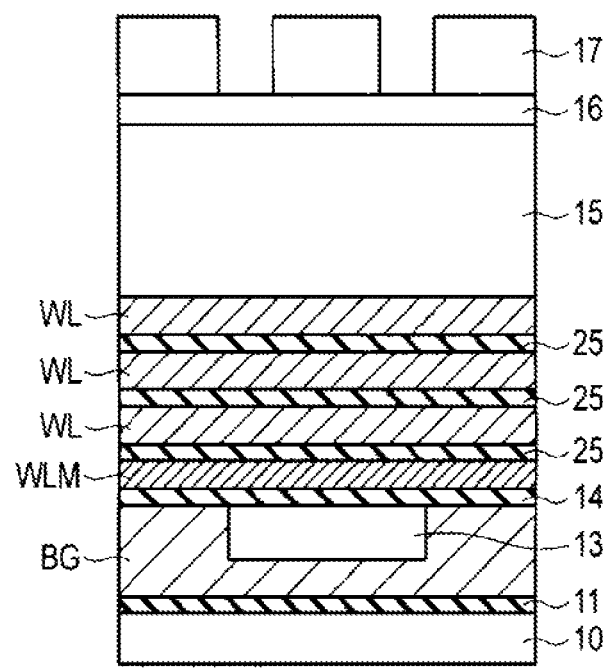
FIG. 8 is a sectional view for explaining the method for manufacturing the semiconductor device according to the embodiment, the sectional view showing a process following the process of FIG. 7.

Then, as shown in FIG. 8, on the uppermost layer (here, the uppermost electrode layer WL) of a stacked body including the electrode layers WL and WLM and the insulating layers 14 and 25, a mask layer 15, an intermediate film 16, and a resist pattern 17 are formed in this order. The mask layer 15 is, for example, a carbon layer. The intermediate film 16 is, for example, a silicon oxide layer. The resist pattern 17 has a plurality of openings (an opening pattern). Below the openings, and vertically aligned therewith, is the sacrificial film 13.

Figure 9:
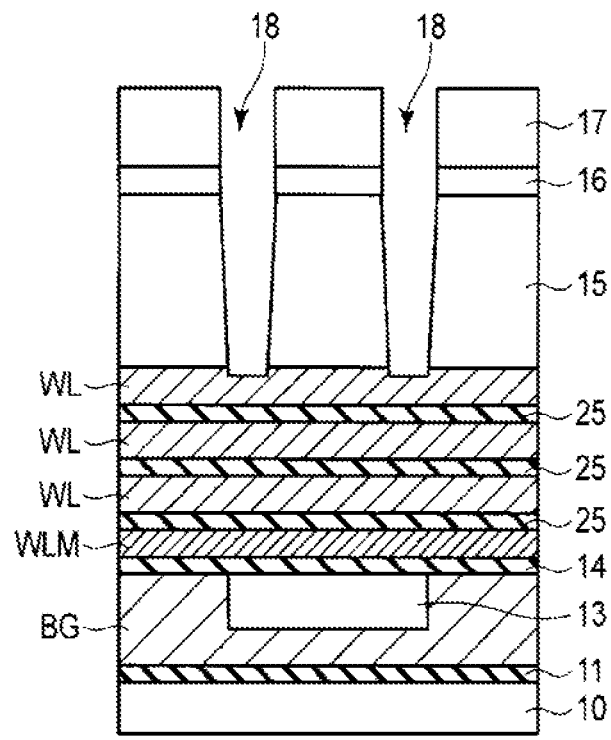
FIG. 9 is a sectional view for explaining the method for manufacturing the semiconductor device according to the embodiment, the sectional view showing a process following the process of FIG. 8.

Next, as shown in FIG. 9, the intermediate film 16 and the mask layer 15 are selectively etched by a RIE (reactive ion etching) process, for example, by using the resist pattern 17 as a mask to form a plurality of holes 18 in the intermediate film 16 and the mask layer 15. The holes 18 penetrate the mask layer 15 and reach the electrode layer WL which is the uppermost layer.

Figure 10:
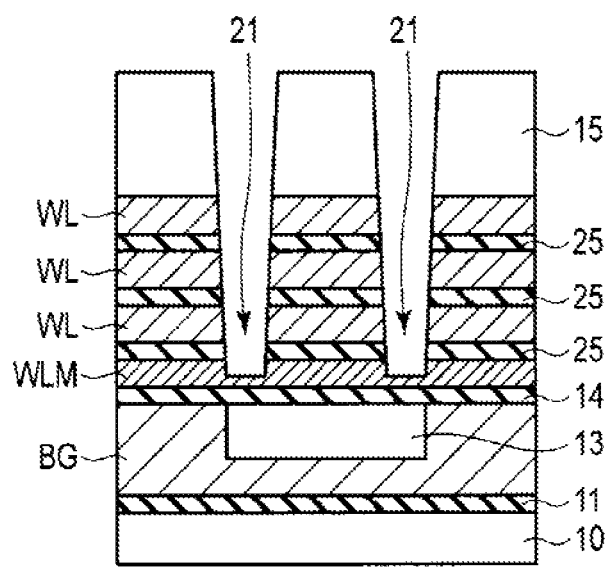
FIG. 10 is a sectional view for explaining the method for manufacturing the semiconductor device according to the embodiment, the sectional view showing a process following the process of FIG. 9.

Then, after the resist pattern 17 and the intermediate film 16 are removed, as shown in FIG. 10, the electrode layers WL and the insulating layers 25 below the mask layer 15 are etched by the RIE process, for example, by using the mask layer 15 as a mask to form selectively a plurality of holes 21 penetrating the electrode layers WL and the insulating layers 25. Below the holes 21, the sacrificial film 13 is located.

A gas used in the RIE process at this time (at the time of etching of the electrode layers WL and the insulating layers 25) is a gas that can etch both the material of the electrode layer WL and the material of the insulating layer 25 efficiently. The etching rate of the gas on the material of the electrode layer WL and the material of the insulating layer 25 is higher than the etching rate of the material of the electrode layer WLM.

For example, when the material of the electrode layer WL is silicon, the material of the insulating layer 25 is silicon oxide, and the material of the electrode layer WLM is tungsten, a mixture of a gas containing Br (bromine) and a gas containing F (fluorine) can be used.

The use of such a gas makes it possible to etch the electrode layers WL and the insulating layers 25 continuously and collectively under the same condition by using the same gas and thus eliminate the need to change etch gases for the electrode layers WL and the insulating layers 25. As a result, an efficient RIE process is performed and cost reduction can be achieved.

By using the above gas, the following advantage can also be produced.

When the hole diameter of the hole 21 is small and the stacked body is thick due to a large number of electrode layers WL, that is, when the aspect ratio (the ratio of the depth to the hole diameter) of the hole 21 increases, a change of the hole diameter affects the etching rate (a variation in the etch rate).

For example, when the hole diameter of the hole 21 is about 50 nm, the thickness of the stacked body in which the hole 21 is formed is 1 to 2 μm, and the aspect ratio of the hole 21 is about 20 to 40, with only a 10%-to-20% change of the hole diameter, the depth sometimes varies in the 200 nm-to-400 nm range when about 1 to 2 μm of hole 21 is etched in the depth direction.

Below the hole 21, the sacrificial film 13 embedded in the back-gate layer BG is present, and the sacrificial film 13 is, for example, a thin film having a thickness of about 100 nm. The material (silicon nitride or carbon) of the sacrificial film 13 is not highly resistant to the above-described gas that can etch both the electrode layer WL and the insulating layer 25 efficiently.

Figure 15:
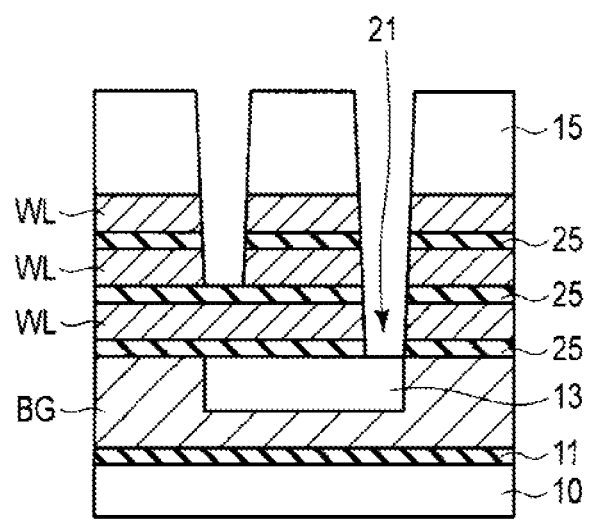
FIG. 15 is a sectional view for explaining a method for manufacturing a semiconductor device according to a conventional example.

Therefore, without the presence of the electrode layer WLM (as shown in FIG. 15), if the hole 21 is processed continuously under the condition that the electrode layers WL and the insulating layers 25 are etched collectively, since etching cannot be stopped at the sacrificial film 13 and the sacrificial film 13 is thin, as shown in FIG. 15, processing failure (process defect, such as the hole 21 piercing the sacrificial film 13) may occur. The occurrence of such a process defect does not allow the channel body (the U-shaped silicon pillar) 20 to be shaped properly, causing the occurrence of device characteristic variation.

In particular, if the hole diameter varies among the holes 21 when the aspect ratio of the hole 21 is high, even a slight difference in hole diameter causes a difference in etch rate among the holes 21, and, when one of the holes 21 formed at a relatively low etching rate reaches the sacrificial film 13, another hole 21 with a relatively high etching rate may have already pierced the sacrificial film 13.

However, in this embodiment, since the electrode layers WL and the insulating layers 25 are formed on the sacrificial film 13 (the back-gate layer BG) and the electrode layer WLM is formed between the stack of alternating electrode layers WL and the insulating layers 25 and the sacrificial film 13, and a gas enabling a higher etching rate of the electrode layer WL and the insulating layer 25 as compared to the etching rate of the electrode layer WLM is used, etching stops at the electrode layer WLM because the metal material of the electrode layer WLM is resistant to etching by the gas species used to etch the electrode layer WL and the insulating layer 25. Thus, during etching of the opening 18 down to the electrode layer WLM, the electrode layer WLM is not etched through and the sacrificial film 13 below the electrode layer WLM is not etched. This makes it possible to suppress the occurrence of process variation between the stacked bodies and minimizes device characteristic variation within the stacked body.

Figure 11:
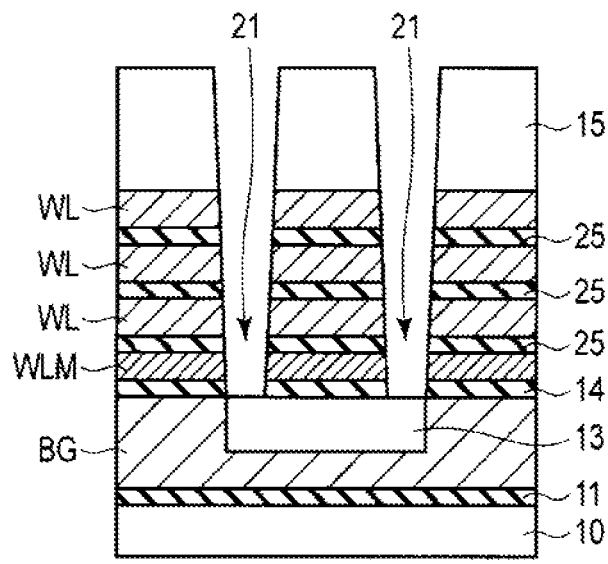
FIG. 11 is a sectional view for explaining the method for manufacturing the semiconductor device according to the embodiment, the sectional view showing a process following the process of FIG. 10.

Next, as shown in FIG. 11, the electrode layer WLM and the insulating layer 14 under the electrode layer WLM are etched by the RIE process by using the mask layer 15 as a mask in such a way that the surface of the sacrificial film 13 is exposed at the bottom of the hole 21.

The gas used in the RIE process at this time, for example, is a gas that can etch both the material of the electrode layer WLM and the material of the insulating layer 14 efficiently. For example, when the material of the electrode layer WLM is tungsten and the material of the insulating layer 14 is silicon oxide, as the above-described etching gas, a gas containing Cl (chlorine), F (fluorine), or both of Cl (chlorine) and F (fluorine) can be used.

Figure 12:
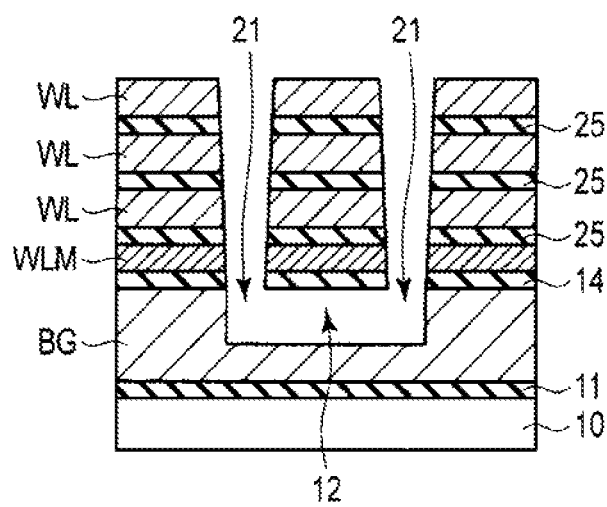
FIG. 12 is a sectional view for explaining the method for manufacturing the semiconductor device according to the embodiment, the sectional view showing a process following the process of FIG. 11.

Then, as shown in FIG. 12, the sacrificial film 13 is removed by wet etching thereof through the holes 21. As a result, the pair of holes 21 are located next to each other and a concave portion 12 under the pair of holes 21 connect the holes 21 to each other, thereby forming a memory hole MH in the shape of the letter U.

Figure 13:
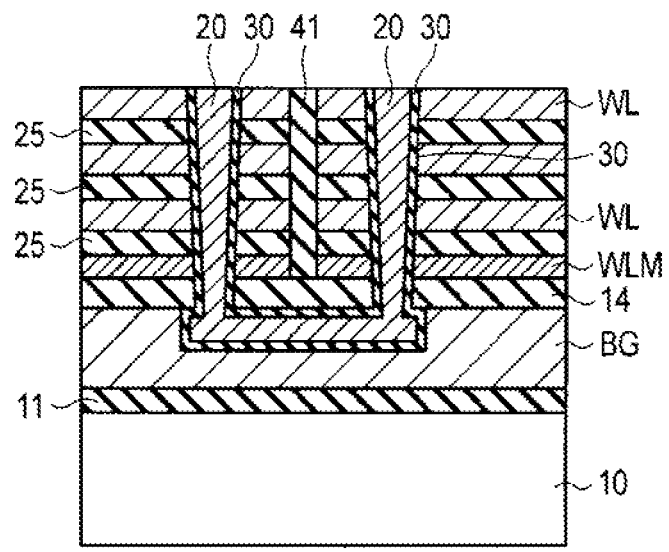
FIG. 13 is a sectional view for explaining the method for manufacturing the semiconductor device according to the embodiment, the sectional view showing a process following the process of FIG. 12.

Next, as shown in FIG. 13, an insulating film 30 is formed on the inner wall of the memory hole MH by using the CVD process, for example. Then, a channel body 20 (a pair of columnar portions, and a joining portion) in the shape of the letter U is formed in the memory hole MH by using the CVD process, for example, with the insulating film 30 placed between the channel body 20 and the memory hole MH.

In other words, in a space of the memory hole MH, the space corresponding to the pair of holes 21, a channel body 20 formed of a pair of columnar silicon layers (columnar silicon pillars) is formed, and, in a space of the memory hole MH, the space corresponding to the concave portion 12, a channel body (a joining portion JP of FIG. 1) formed of a silicon layer connecting the lower ends of the above-mentioned pair of columnar silicon pillars is formed.

Then, a stacked body including the electrode layer WLM, the electrode layers WL, and the insulating layers 25 is divided into a plurality of blocks, and an insulator 41 is embedded between the blocks.

Figure 14:
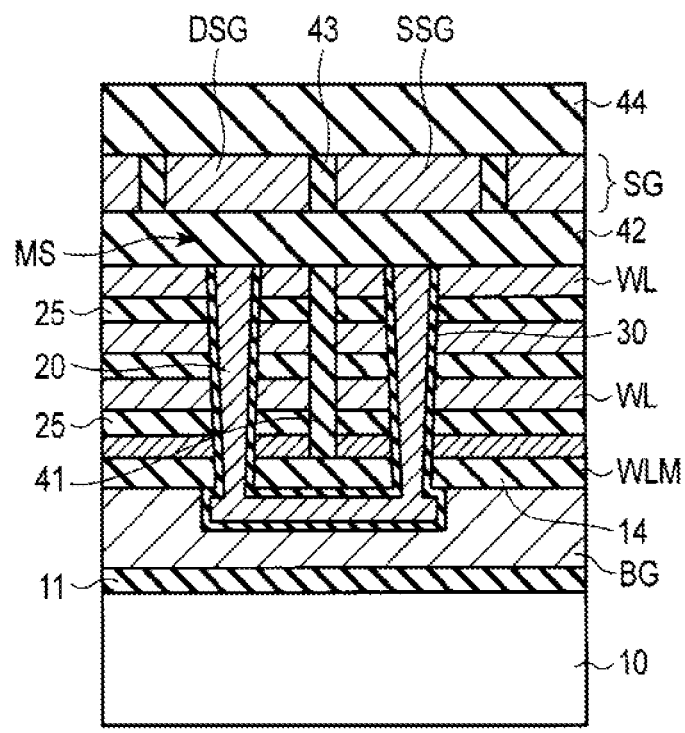
FIG. 14 is a sectional view for explaining the method for manufacturing the semiconductor device according to the embodiment, the sectional view showing a process following the process of FIG. 13.

Next, as shown in FIG. 14, an upper gate layer SG is formed with an insulating layer 42 placed between the stacked body and the upper gate layer SG. Then, patterning is performed on the upper gate layer SG, and the upper gate layer SG is divided into a drain-side selection gate DSG and a source-side selection gate SSG. Between the drain-side selection gate DSG and the source-side selection gate SSG, an insulating layer 43 is provided. Then, an insulating layer 44 is formed on the drain-side selection gate DSG and the source-side selection gate SSG.

Subsequently, known processes are performed and the structure shown in FIG. 1 is obtained.

That is, after a hole penetrating the insulating layer 44, the drain-side selection gate DSG, and the insulating layer 42 and reaching one upper end in the channel body 20 in the shape of the letter of U is formed, a gate insulation film 35 is formed on the side wall of the hole, and a channel body 45 is then formed on the inside of the gate insulation film 35.

In a like manner, after a hole penetrating the insulating layer 44, the source-side selection gate SSG, and the insulating layer 42 and reaching the other upper end of the channel body 20 in the shape of the letter U is formed, a gate insulation film 36 is formed on the side wall of the hole, and the channel body 45 is then formed on the inside of the gate insulation film 36.

Then, source lines SL, bit lines BL, the other upper wiring, and the like are formed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
a semiconductor substrate;
a back-gate layer formed above the semiconductor substrate;
a stacked body formed above the back-gate layer, the stacked body including a plurality of insulating layers alternately formed between a plurality of electrode layers, wherein a lowermost electrode layer of the plurality of electrode layers contains a metal and remaining electrode layers of the plurality of electrode layers other than the lowermost electrode layer do not contain the metal of the lowermost electrode layer;
a pair of columnar semiconductor layers penetrating the stacked body; and
a semiconductor layer connecting lower portions of the pair of columnar semiconductor layers, the semiconductor layer embedded in a surface of the back-gate layer.

2. The semiconductor device according to claim 1, wherein the plurality of insulating layers comprise a material having an etch rate that is greater than an etch rate of the lowermost electrode layer.

3. The semiconductor device according to claim 2, wherein the remaining electrode layers comprise a material having an etch rate that is greater than the etch rate of the lowermost electrode layer.

4. The semiconductor device according to claim 3, wherein the plurality of insulating layers comprise silicon oxide, the lowermost electrode layer comprises tungsten or tungsten silicide, and the remaining electrode layers comprise silicon.

5. The semiconductor device according to claim 1, wherein each of the remaining electrode layers comprises a thickness that is greater than a thickness of the lowermost electrode layer.

6. The semiconductor device according to claim 5, wherein the remaining electrode layers have almost a same thickness.

7. A semiconductor device, comprising:
a semiconductor substrate;
a back-gate layer formed above the semiconductor substrate;
a stacked body formed above the back-gate layer and comprising a plurality of insulating layers alternately formed between a plurality of electrode layers, the stacked body having a lowermost electrode layer of the plurality of electrode layers that contains a metal and remaining electrode layers of the plurality of electrode layers other than the lowermost electrode layer;
a pair of columnar semiconductor layers penetrating the stacked body; and
a semiconductor layer connecting lower portions of the pair of columnar semiconductor layers, the semiconductor layer embedded in a surface of the back-gate layer, wherein
the material of the plurality of insulating layers contains silicon oxide,
the material of the lowermost electrode layer contains tungsten or tungsten silicide, and
the material of the remaining electrode layers contains silicon.

8. The semiconductor device according to claim 7, wherein the plurality of insulating layers comprise a material having an etch rate that is greater than an etch rate of the lowermost electrode layer.

9. The semiconductor device according to claim 8, wherein the remaining electrode layers comprise a material having an etch rate that is greater than the etch rate of the lowermost electrode layer.

10. The semiconductor device according to claim 7, wherein
each of the remaining electrode layers comprises a thickness that is greater than a thickness of the lowermost electrode layer.

11. The semiconductor device according to claim 10, wherein
the remaining electrode layers have almost a same thickness.

12. A semiconductor device, comprising:
a semiconductor substrate;
a back-gate layer formed on the semiconductor substrate;
a stacked body comprising a plurality of insulating layers alternately formed between a plurality of electrode layers formed on the back-gate layer, wherein a lowermost electrode layer of the plurality of electrode layers comprises a metal and remaining electrode layers of the plurality of electrode layers other than the lowermost electrode layer do not contain the metal of the lowermost electrode layer;
a pair of columnar semiconductor layers penetrating the stacked body; and
a semiconductor layer connecting lower portions of the pair of columnar semiconductor layers, the semiconductor layer embedded in a surface of the back-gate layer.

13. The semiconductor device according to claim 12, wherein
the plurality of insulating layers comprise a material having an etch rate that is greater than an etch rate of the lowermost electrode layer.

14. The semiconductor device according to claim 13, wherein
the remaining electrode layers comprise a material having an etch rate that is greater than the etch rate of the lowermost electrode layer.

15. The semiconductor device according to claim 12, wherein
  the plurality of insulating layers comprise silicon oxide,
  the lowermost electrode layer comprises tungsten or tungsten silicide, and
  the remaining electrode layers comprise silicon.

16. The semiconductor device according to claim 12, wherein
  each of the remaining electrode layers comprises a thickness that is greater than a thickness of the lowermost electrode layer.

17. The semiconductor device according to claim 16, wherein
  the thickness of the remaining electrode layers are substantially the same.

18. The semiconductor device according to claim 12, further comprising:
  an insulator penetrating the stacked body.

19. The semiconductor device according to claim 18, wherein
  the insulator separates the lowermost electrode layer.

* * * * *